(12) United States Patent  (10) Patent No.: US 8,988,101 B2
Song et al.  (45) Date of Patent: Mar. 24, 2015

(54) METHOD FOR OPERATING MEMORY DEVICE AND APPARATUSES PERFORMING THE METHOD

(75) Inventors: In Dal Song, Seoul (KR); Jung Hwan Choi, Hwaseong-si (KR); Yun Seok Yang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 258 days.

(21) Appl. No.: 13/617,395

(22) Filed: Sep. 14, 2012

(65) Prior Publication Data

US 2013/0069689 A1 Mar. 21, 2013

(30) Foreign Application Priority Data

Sep. 21, 2011 (KR) .......................... 10-2011-0095354

(51) Int. Cl.
*H03K 17/16* (2006.01)
*H03K 19/003* (2006.01)
*G11C 7/10* (2006.01)
*H03K 19/00* (2006.01)

(52) U.S. Cl.
CPC .......... *G11C 7/1057* (2013.01); *H03K 19/0005* (2013.01); *G11C 7/1084* (2013.01)
USPC .......................... 326/30; 365/189.05; 365/222

(58) Field of Classification Search
None
See application file for complete search history.

(56) References Cited

U.S. PATENT DOCUMENTS

| 7,138,823 | B2 | 11/2006 | Janzen et al. | |
|---|---|---|---|---|
| 7,176,711 | B2 | 2/2007 | Park et al. | |
| 7,372,293 | B2 | 5/2008 | Cox et al. | |
| 2005/0268059 | A1* | 12/2005 | LaBerge | 711/167 |
| 2007/0126468 | A1* | 6/2007 | Kim | 326/30 |

FOREIGN PATENT DOCUMENTS

| KR | 100532972 B1 | 11/2005 |
|---|---|---|
| KR | 100951091 B1 | 7/2008 |
| KR | 100892675 B1 | 3/2009 |

* cited by examiner

*Primary Examiner* — Jany Richardson
(74) *Attorney, Agent, or Firm* — Harness, Dickey & Pierce, PLC

(57) ABSTRACT

According to example embodiments, a method for operating a memory device includes receiving an on-die termination (ODT) signal through an ODT pin, and issuing a command or controlling an ODT circuit according to the ODT signal.

20 Claims, 12 Drawing Sheets

FIG. 7

DRV = 50ohm, Rtt ON = 50ohm, Rtt_WR = ∞, Rtt_Nom1 = 55ohm, Rtt_Nom0 = ∞, Ron = hi-Z

| DIMM | Rank | WRITE ||||||| READ |||||
|---|---|---|---|---|---|---|---|---|---|---|---|---|
| | | Memory Controller | DIMM 0 || DIMM 1 || | Memory Controller | DIMM 0 || DIMM 1 ||
| | | | Rank 0 | Rank 1 | Rank 2 | Rank 3 | | Rank 0 | Rank 1 | Rank 2 | Rank 3 |
| 0 | 0 | DRV | Rtt_WR | Rtt_Nom1 | Rtt_Nom1 | Rtt_Nom1 | Rtt ON | Ron | Rtt_Nom0 | Rtt_Nom1 | Rtt_Nom1 |
| 0 | 1 | DRV | Rtt_Nom1 | Rtt_WR | Rtt_Nom1 | Rtt_Nom1 | Rtt ON | Rtt_Nom0 | Ron | Rtt_Nom1 | Rtt_Nom1 |
| 1 | 2 | DRV | Rtt_Nom1 | Rtt_Nom1 | Rtt_WR | Rtt_Nom1 | Rtt ON | Rtt_Nom1 | Rtt_Nom1 | Ron | Rtt_Nom0 |
| 1 | 3 | DRV | Rtt_Nom1 | Rtt_Nom1 | Rtt_Nom1 | Rtt_WR | Rtt ON | Rtt_Nom1 | Rtt_Nom1 | Rtt_Nom0 | Ron |

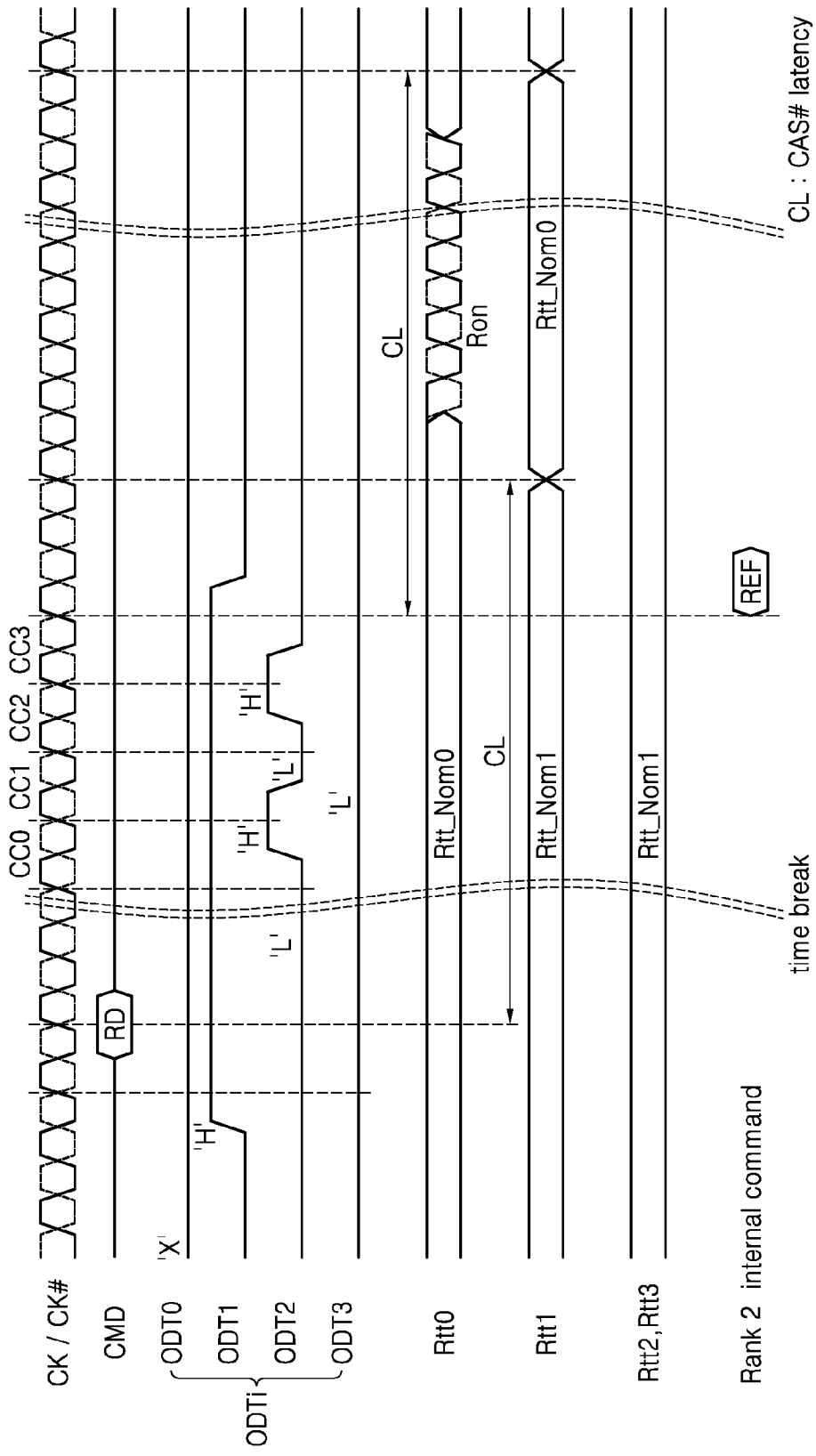

METHOD FOR OPERATING MEMORY DEVICE AND APPARATUSES PERFORMING THE METHOD

CROSS-REFERENCE TO RELATED APPLICATIONS

This application claims priority under 35 U.S.C. §119(a) to Korean Patent Application No. 10-2011-0095354 filed on Sep. 21, 2011, the entire contents of which are hereby incorporated by reference.

BACKGROUND

Example embodiments of inventive concepts relate to a memory device, and for example, to an operation method of a memory device which may issue a command according to a level of a control signal input through a control pin and apparatuses for performing the method.

A command may control an operation of the memory device. A command may be generated and issued as a result of decoding a plurality of control signals. When the memory device is powered down, a receiver of the memory device may be turned off and the command may not be issued.

SUMMARY

Example embodiments of inventive concepts relate to a memory device and/or a method of operating a memory device According to example embodiments, a method for operating a memory device includes receiving a control signal through a control pin, and issuing a command or performing a control operation according to a level of the control signal.

According to example embodiments, the control pin may be an ODT pin, the control signal may be an ODT signal, and the control operation may be an ODT control operation. The ODT control operation may include an operation changing a termination resistance of an ODT circuit or turning off the ODT circuit.

When a level of the ODT signal is continuously high at each edge of a clock signal, an operation changing the termination resistance in response to the ODT signal may be performed. When a level of the ODT signal at each edge of a clock signal is toggling, the command may be issued in response to the ODT signal. When a level of the ODT signal at each edge of a clock signal repeats low and high, the command may be issued in response to the ODT signal.

The command may be a refresh command.

According to example embodiments, the command may include a precharge all banks command. According to example embodiments, the command may be issued when the memory device is powered down.

According to example embodiments of inventive concepts, a memory device includes an ODT pin receiving a control signal, and a command decoder issuing a command according to a level of the control signal.

According to example embodiments, when the control signal is an ODT signal and the control pin is an ODT pin, the memory device may further include an ODT detector detecting a level of the ODT signal, an ODT circuit including a termination resistor and a switch, and an ODT control circuit controlling the ODT circuit to change a termination resistance of the ODT circuit or to turn off the ODT circuit according to a level of the ODT signal.

The ODT detector may include a plurality of latches, and an $i^{th}$ latch ($1<i \le (N-1)$) detects a level of an output signal of a $(i-1)^{th}$ latch in response to a clock signal.

When a level of the ODT signal detected at each edge of a clock signal is continuously high, the termination resistance may be changed in response to the ODT signal. When a level of the ODT signal at each edge of a clock signal is toggling, the command decoder may issue a command in response to the ODT signal. When a level of the ODT signal at each edge of a clock signal repeats low and high, a command may be issued in response to the ODT signal.

The command may be a refresh command.

According to example embodiments, the command may be a precharge all banks command. When the memory device is powered down, the command may be issued.

According to example embodiments of inventive concepts, a memory module includes at least one rank including the at least one memory device.

The memory module may be a dual in-line memory module (DIMM), a dual in-line package memory, a single in-line pin package (SIPP) memory, a single in-line memory module (SIMM), a dual in-line memory module (DIMM) or a small outline DIMM (SO-DIMM).

Example embodiments of inventive concepts relate to a memory system, including a memory controller outputting a control signal, and a memory module including at least a rank including the at least one memory device.

Example embodiments of inventive concepts relate to a memory controller, including a register receiving and storing commands, an arbiter selecting one of the commands, a decoder decoding the selected command and generating an ODT signal for issuing the command according to a decoding result and a memory interface outputting the ODT signal.

According to example embodiments, a memory device include an ODT detector configured to generate a first and a second group of signals in response to an ODT signal and a clock signal, an ODT control circuit connected to an ODT circuit, the ODT control circuit configured to receive the first group of signals and control an operation of the ODT circuit in response to the first group of signals, and a control logic connected to a memory cell array, the control logic configured to receive the second group of signals and issue a command to the memory cell array in response to the second group of signals.

The command may be a refresh command.

The command may be a precharge all banks command.

The ODT controller may include a first latch configured to generate a first detection signal in response to detecting a first level of the ODT signal corresponding to a first edge of the clock signal, a second latch configured to generate a second detection signal in response to detecting a second level of the ODT signal corresponding to a second edge of the clock signal, a third latch configured to generate a third detection signal in response to detecting a third level of the ODT signal corresponding to a third edge of the clock signal, and a fourth latch configured to generate a fourth detection signal in response to detecting a fourth level of the ODT signal corresponding to a fourth edge of the clock signal. The ODT controller may be configured to generate the first group of signals based on the first and second detection signals, and the ODT controller may be configured to generate the second group of signals based on the first to fourth detection signals.

The memory device may further include an on-die termination (ODT) pin configured to receive the ODT signal and output the ODT signal to the ODT detector.

BRIEF DESCRIPTION OF THE DRAWINGS

The above and other features and advantages of inventive concepts will become more apparent by describing in detail non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIG. 7 is an ODT matrix of the memory system illustrated in FIG. 1;

FIG. 8 is a timing diagram for explaining an operation of the memory system illustrated in FIG. 1;

DETAILED DESCRIPTION

Figure 1:
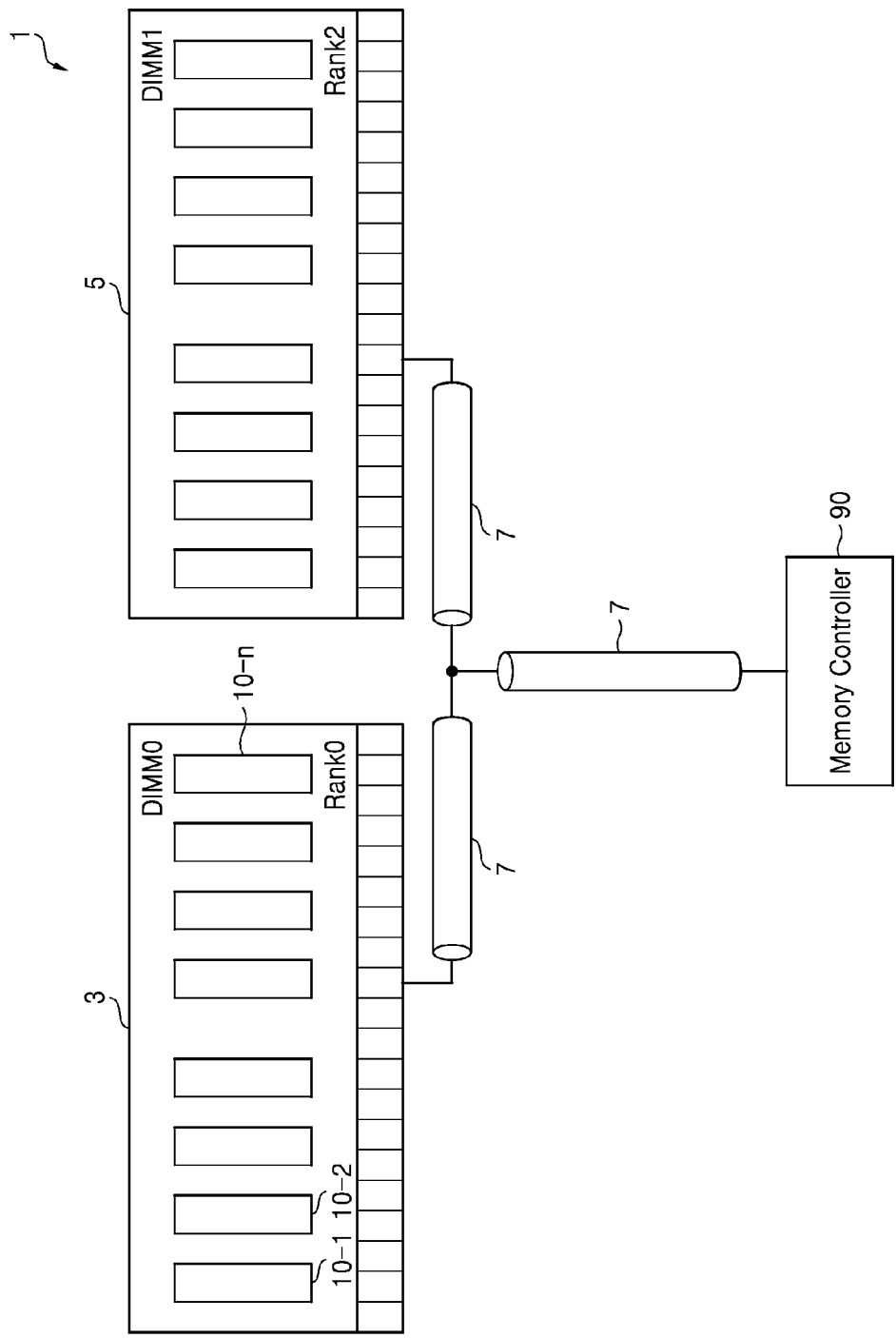
FIG. 1 is a block diagram of a memory system according to example embodiments.

Example embodiments now will be described more fully hereinafter with reference to the accompanying drawings, in which some example embodiments are shown. Example embodiments may, however, be embodied in many different forms and should not be construed as limited to the embodiments set forth herein. Rther, these example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". Other words used to describe the relationship between elements or layers should be interpreted in a like fashion (e.g., "between" versus "directly between," "adjacent" versus "directly adjacent," "on" versus "directly on").

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises," "comprising," "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
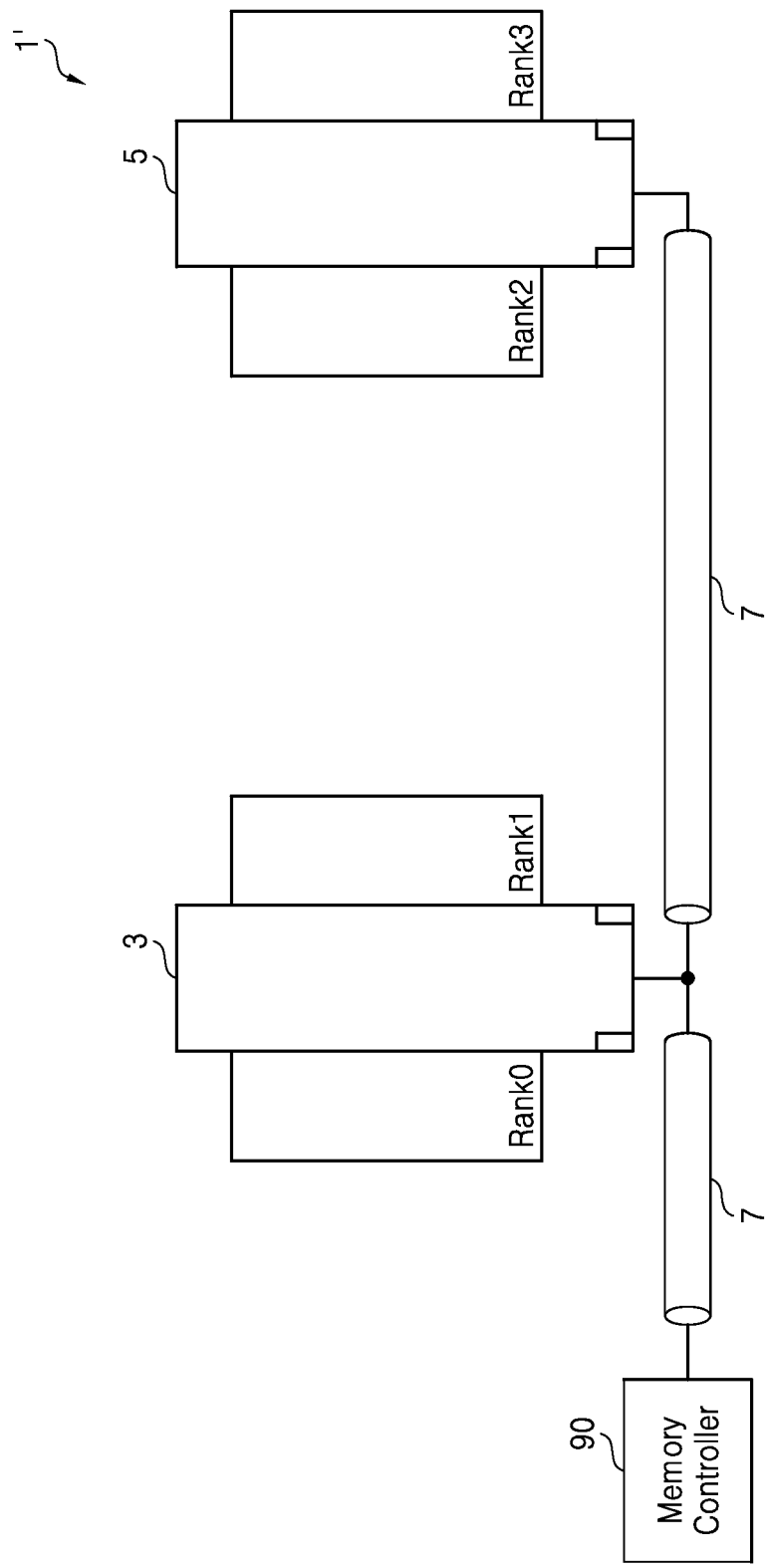
FIG. 2 is a lateral diagram of the memory system illustrated in FIG. 1.

FIG. 1 is a block diagram of a memory system according to example embodiments of inventive concepts, and FIG. 2 is a lateral diagram of the memory system illustrated in FIG. 1. Referring to FIGS. 1 and 2, a memory system 1 or 1' includes a plurality of memory modules 3 and 5 and a memory controller 90.

According to example embodiments, each of the plurality of memory modules 3 and 5 may be one of a dual in-line memory module (DIMM), a dual inline package (DIP) memory module, a single inline pin package (SIPP) memory module, a single in-line memory module (SIMM), and a small outline DIMM (SO-DIMM).

Each of the plurality of memory modules 3 and 5 may be divided into a plurality of ranks Rank0 and Rank1, and Rank2 and Rank3.

Each of the plurality of ranks Rank0 and Rank1, and Rank2 and Rank3 includes a plurality of memory devices 10-1, 10-2, . . . , and 10-n. For example, each of the plurality of memory devices 10-1, 10-2, . . . , and 10-n: generally 10 may be a dynamic random access memory DRAM. However, example embodiments are not restricted to a kind of memory.

Between each of the plurality of memory modules 3 and 5 and a memory controller 90, a transmission line 7 is embodied to transmit and receive data, an address and/or a plurality of control signals. According to example embodiments, the transmission line 7 may be embodied by various methods.

Figure 3:
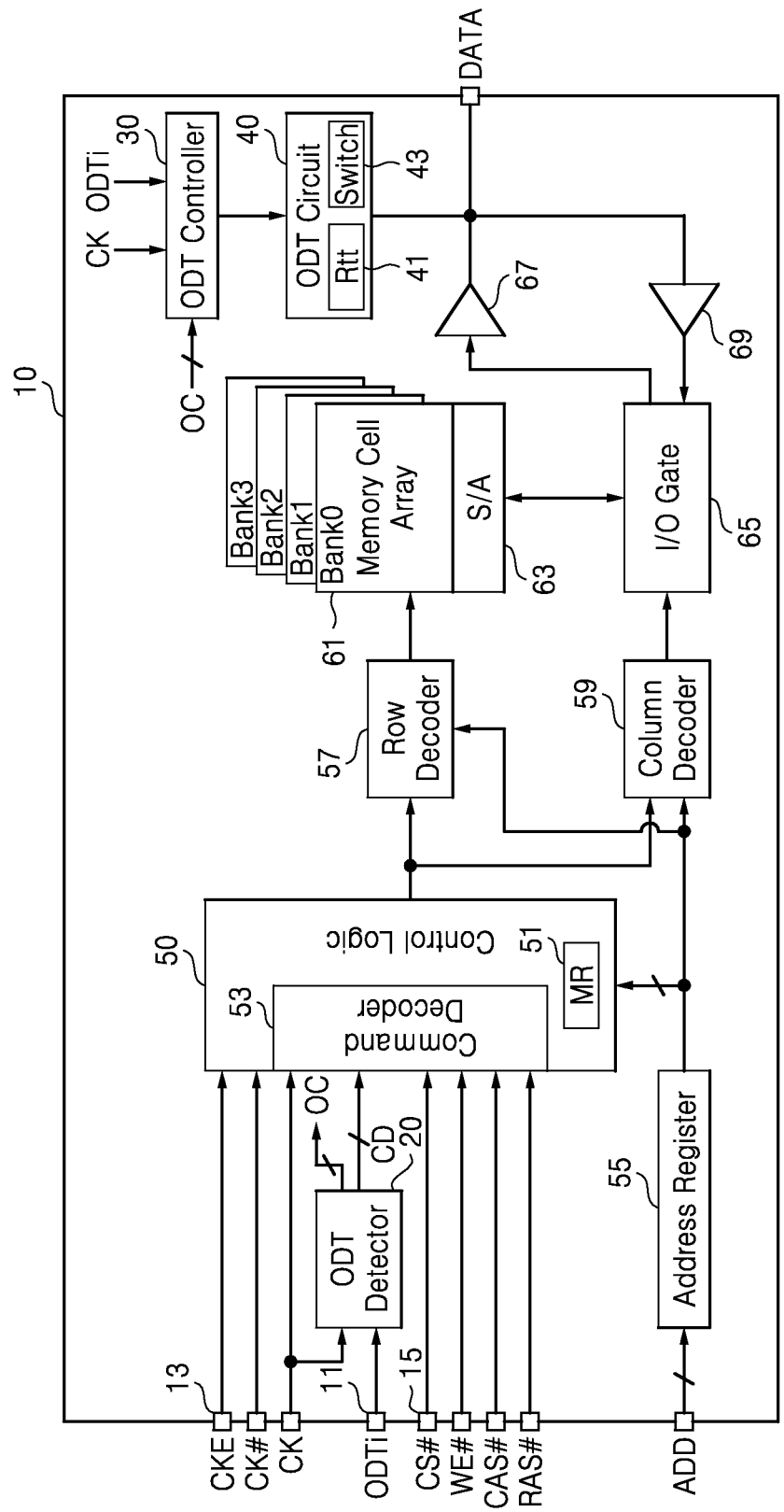
FIG. 3 is a block diagram of a memory device illustrated in FIG. 1.

FIG. 3 is a block diagram of a memory device illustrated in FIG. 1. Referring to FIGS. 1 to 3, a memory device 10 illustrated in FIG. 3 depicts one of the plurality of memory devices 10-1, 10-2, . . . , and 10-n.

The memory device 10 includes an on-die termination (ODT) pin 11, a CKE pin 13, a CS# pin 15, an ODT detector 20, an ODT controller 30, an ODT circuit 40, a control logic 50, an address register 55, a row decoder 57, a column decoder 59, a plurality of memory cell arrays 61, a sense amplifier 63, an input/output gate 65, a driver 67 and a receiver (or an input buffer) 69.

A control pin is a pin for controlling each of the plurality of ranks Rank0 and Rank1, and Rank2 and Rank3. The control pin may be an on-die terminal (ODT) pin 11, a CKE pin 13 or a CS# pin 15.

A CKE pin 13 receives a clock enable signal CKE and a CS# pin 15 receives a chip selection signal CS#. An ODT pin 11 receives an ODT signal (ODTi: i is an integer more than 0)

output from the memory controller 90. The ODT signal ODTi is used to change resistance of a termination resistor Rtt 41 or to issue a command.

According to example embodiments, the ODT signal ODTi may be used to turn off an ODT circuit 40, and/or turn on the ODT circuit 40. Turning off the ODT circuit 40 means on-die terminal off (ODT OFF).

Referring to FIGS. 1 to 3, impedance mismatching in the transmission line 7 may induce distortion and interference of a signal. When an output impedance of the memory controller 90, an impedance of the transmission line 7 and each impedance of the plurality of memory devices 10-1, 10-2, . . . , 10-n are not equal to each other, the impedance mismatching occurs. Accordingly, to reduce (and/or minimize) distortion of the signal, the termination resistor 41 may be adjusted to match an impedance of the transmission line 7 with each impedance of the plurality of memory devices 10-1, 10-2, . . . , 10-n.

An ODT detector 20 detects a level of an input ODT signal ODTi, and issues a command or controls an operation of the ODT circuit 40 according to a detection result. Controlling the ODT circuit 40 means changing a resistance of the termination resistor 41, turning off the ODT circuit 40, and/or turning on the ODT circuit 40.

Figure 4:
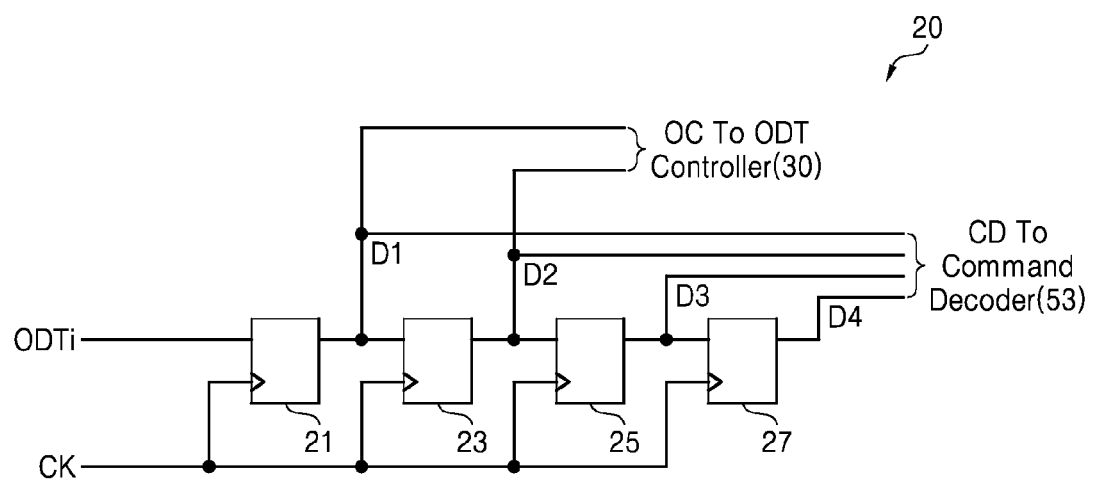
FIG. 4 is a block diagram of an ODT detector illustrated in FIG. 3.

FIG. 4 is a block diagram of the ODT detector illustrated in FIG. 3. Referring to FIGS. 1 to 4, the ODT detector 20 includes a plurality of latches 21, 23, 25 and 27.

A first latch 21 detects a level of an ODT signal ODTi at a current cycle (CC3 of FIG. 8) in response to a rising edge or a falling edge of a clock signal CK and outputs a first detection signal D1 to an ODT controller 30 and a command decoder 53 according to a detection result. A second latch 23 detects a level of the ODT signal ODTi at a previous cycle (CC2 of FIG. 8) in response to a rising edge or a falling edge of a clock signal CK and outputs a second detection signal D2 to the ODT controller 30 and the command decoder 53 according to a detection result. A third latch 25 detects a level of the ODT signal ODTi at a previous cycle (CC1 of FIG. 8) in response to a rising edge or a falling edge of a clock signal CK and outputs a third detection signal D3 to the command decoder 53 according to a detection result. A fourth latch 27 detects a level of the ODT signal ODTi at a previous cycle (CC0 of FIG. 8) in response to a rising edge or a falling edge of a clock signal CK and outputs a fourth detection signal D4 to the command decoder 53 according to a detection result.

Each level of the plurality of detection signals D1, D2, D3 and D4 may be indicated as shown in Table 1.

TABLE 1

| ODT | | | | |
|---|---|---|---|---|
| D4 | D3 | D2 | D1 | Operation |
| X | X | H | L | Rtt_Nom0->Rtt_Nom1 |
| X | X | H | H | Rtt_Nom1->Rtt_Nom0 |
| L | H | L | H | Refresh or Precharge all banks |
| X | X | X | X | Rtt_Nom0->Ron |

Here, the 'X' means DON'T CARE, 'H' means a high level and 'L' means a low level.

Referring to table 1, when the ODT controller 30 receives a first detection signal D1 having a low level and a second detection signal D2 having a high level H, the ODT controller 30 outputs a control signal which controls the ODT circuit 40 to change resistance of the termination resistor 41 from a resistance Rtt_Nom0 to a resistance Rtt_Nom1.

When the ODT controller 30 receives a first detection signal D1 having a high level and a second detection signal D2 having a high level, the ODT controller 30 outputs a control signal which controls the ODT circuit 40 to change a resistance of the termination resistor 41 from a resistance Rtt_Nom1 to a resistance Rtt_Nom0.

When the command decoder 53 receives a first detection signal D1 having a high level H, a second detection signal D2 having a low level L, a third detection signal D3 having a high level H and a fourth detection signal D4 having a low level L, the command decoder 53 generates a refresh command according to the plurality of detection signals D1, D2, D3 and D4 and issues the refresh command to a plurality of memory cell arrays 61.

When the memory device 10 is a volatile memory like a DRAM, the memory device 10 should be refreshed periodically. Accordingly, the memory device 10 may issue a refresh command according to a level of an ODT signal ODTi even when the memory device 10 is powered down. According to example embodiments, the command decoder 53 may issue a precharge all banks command according to levels of the plurality of detection signals D1, D2, D3 and D4 respectively.

All banks, e.g., Bank0, Bank1, Bank2 and Bank3, should be precharged. The precharge all banks command precharges all banks Bank0, Bank1, Bank2 and Bank3 simultaneously.

A command issued according to the plurality of detection signals D1, D2, D3 and D4 is not restricted to a precharge all banks command; however, various commands may be issued according to example embodiments. Referring to FIG. 4, a first group of signals OC include a plurality of detection signals D1 and D2, and a second group of signals CD include a plurality of detection signals D1, D2, D3 and D4.

The ODT controller 30 receives the first group of signals OC and outputs a signal controlling an operation of the ODT circuit 40. The ODT circuit 40 includes the termination resistor 41 and a switch 43. Resistance of the termination resistor 41 is set by a mode register 51. According to example embodiments, the resistance of the termination resistor 41 may be changed by a signal output from the ODT controller 30.

Figure 5:
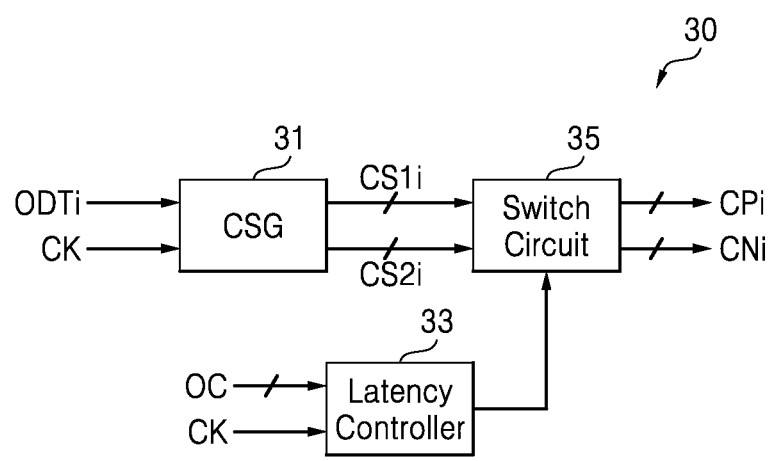
FIG. 5 is a block diagram of an ODT controller illustrated in FIG. 3.

FIG. 5 is a block diagram of the ODT controller illustrated in FIG. 3. Referring to FIGS. 3 and 5, the ODT controller 30 includes a control signal generator 31, a latency controller 33, and a switch circuit 35, but example embodiments are not limited thereto.

A control signal generator 31 generates a plurality of control signals CS1$i$ and CS2$i$, where i is a natural number, according to an ODT signal ODTi and a clock signal CK. A latency controller 33 controls a switch circuit 35 to change the resistance of the termination resistor 41 in response to the first group of signals OC.

The switch circuit 35 performs a switching operation on the plurality of control signals CS1$i$ and CS2$i$ in response to signals output from the latency controller 33 and outputs a plurality of control signals CPi and CNi, where i is a natural number. The ODT circuit 40 is turned on or turned off according to an operation of a switch 43. The switch 43 is controlled by a signal output from the ODT controller 30.

Figure 6:
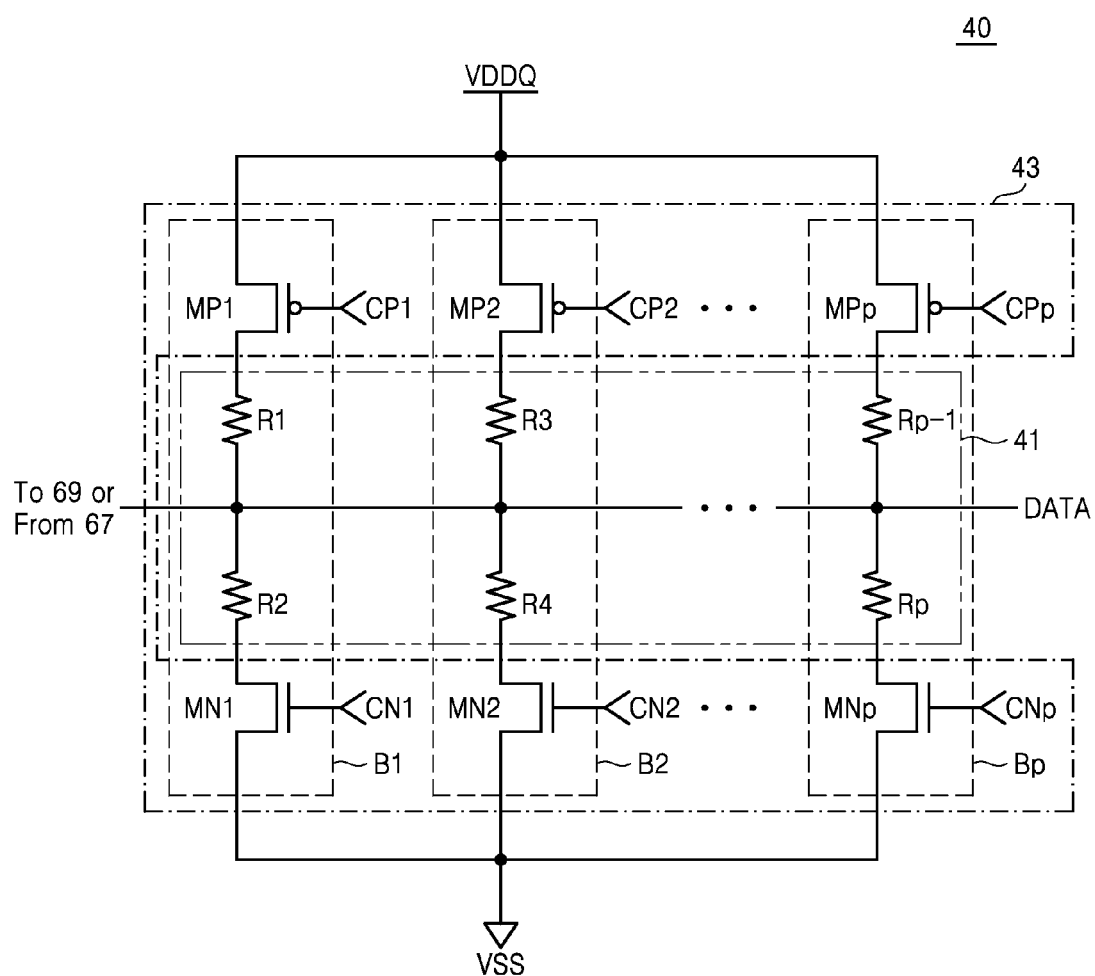
FIG. 6 is a block diagram of an ODT circuit illustrated in FIG. 3.

FIG. 6 is a block diagram of the ODT circuit illustrated in FIG. 3.

Referring to FIGS. 3 and 6, the ODT circuit 40 includes a plurality of branches B1 to Bp, where p is a natural number. A branch B1 includes a first switch MP1, a first resistor R1, a second resistor R2 and a second switch MN1 connected in series between a power supply VDDQ and a ground VSS.

The first switch MP1 is embodied in a PMOS transistor and a second switch MN1 is embodied in a NMOS transistor. The termination resistor 41 is an equivalent resistor of a plurality of resistors R1 to Rp according to each switching of a plurality of switches MP1, MN1, . . . , MPp and MNp, where p is a natural number.

The switch 43 includes the plurality of switches MP1, MN1, . . . , MPp and MNp. Each of the plurality of switches MP1, MN1, . . . , MPp and MNp is turned on or turned off in response to each of control signals CP1, CN1, . . . , CPp and CNp output from the ODT controller 30.

When each level of control signals CP1 to CPp is high and each level of control signals CN1 to CNp is low, each of the plurality of switches MP1, MN1, . . . , MPp and MNp is turned off. Accordingly, the ODT circuit 40 is turned off. When a level of a control signal CP1 is low, a level of a control signal CN1 is high, each level of control signals CP2 to CPp is high and each level of control signals CN2 to CNp is low, switches MP1 and MN1 are turned on. Accordingly, the termination resistor 41 is an equivalent resistor of resistors R1 and R2.

When each level of control signals CP1 and CP2 is low, each level of control signals CN1 and CN2 is high, each level of control signals CP3 to CPp is high and each level of control signals CN3 to CNp is low, switches MP1, MP2, MN1 and MN2 are turned on. Accordingly, the termination resistor 41 is an equivalent resistor of resistors R1, R2, R3 and R4.

Similarly, the ODT circuit 40 may generate resistance of the termination resistor 41 to vary according to control signals CP1, CN1, . . . , CPp and CNp.

A control logic 50 outputs signals controlling a row decoder 57 and a column decoder 59 in response to a plurality of control signals CKE, CK#, ODTi, CS#, WE#, CAS# and RAS#.

The sign '#' means low activation. A clock signal CK, a clock enable signal CKE and a clock bar signal CK# may be output from a clock driver (not shown).

A chip enable bar signal CS#, a write enable bar signal WE#, a column address strobe bar signal CAS#, and a row address strobe bar signal RAS# may be output from a memory controller 90.

The control logic 50 includes a mode register 51 and a command decoder 53. The mode register 51 stores data for controlling various operation modes of the memory device 10. For example, the mode register 51 stores data for resistance of the termination resistor 41. The command decoder 53 decodes a plurality of control signals CS#, WE#, CAS# and RAS# and generates control signals for controlling the row decoder 57 and the column decoder 59 according to a decoding result.

For example, when control signals CS#, CAS# and WE# are low and a control signal RAS# is high, the command decoder 53 generates a write command. According to example embodiments, the command decoder 53 may recognize a command according to an ODT signal ODTi and issue the recognized command. That is, the command decoder 53 generates control signals for controlling the row decoder 57 and the column decoder 59 according to the decoded command.

An address register 55 receives an address ADD including a row address and a column address, transmits the row address to the row decoder 57, and transmits the column address to the column decoder 59. The row decoder 57 decodes a row address received from an address register 55 in response to a control signal output from the control logic 50 and selects one of a plurality of word lines according to a decoding result.

Each of a plurality of memory cell arrays 61 labeled as a bank BANK0 to a bank BANK3 includes a plurality of word lines, a plurality of bit lines, and a plurality of memory cells for storing data.

The sense amplifier 63 senses and amplifies a voltage change of the plurality of bit lines. The column decoder 59 decodes a column address output from the address register 55 in response to a control signal output from the control logic 50, and generates a plurality of column selection signals according to a decoding result.

An input/output gate 65 transmits data or signals to the sense amplifier 63, a driver 67 or a receiver 69 according to the plurality of column selection signals output from the column decoder 59.

During a write operation, the input/output gate 65 transmits data DATA received from the receiver 69 to a plurality of memory cell arrays 61 through a driver according to the plurality of column selection signals output from the column decoder 59. In addition, during a read operation, the input/output gate 65 transmits a plurality of signals sensed and amplified by the sense-amplifier 63 to the driver 67 as data DATA according to the plurality of column selection signals output from the column decoder 59. The driver 67 outputs data DATA to the memory controller 90.

FIG. 7 is an ODT matrix of the memory system illustrated in FIG. 1. Referring to FIGS. 1, 2 and 7, when a read command is issued from the memory controller 90, that is, when a user tries to read data from one of a plurality of memory devices included in a first rank Rank0 of a memory module 3, resistance of a termination resistor of the memory controller 90 has a resistance Rtt ON, resistance of each termination resistor of the plurality of memory devices included in the first rank Rank0 has a resistance Ron, resistance of each termination resistor of a plurality of memory devices included in a second rank Rank1 has a resistance Rtt_Nom0, and resistance of each termination resistor of memory devices included in each of a plurality of ranks Rank2 and Rank3 has a resistance Rtt_Nom1.

When a write command is issued from the memory controller 90, that is, when a user tries to write data in one of a plurality of memory devices included in a first rank Rank0 of the memory module 3, resistance of a termination resistor of the memory controller 90 has a resistance DRV, resistance of each termination resistor of a plurality of memory devices included in the first rank Rank0 has a resistance Rtt_WR, and resistance of each termination resistor of a plurality of memory devices included in a plurality of ranks Rank1, Rank2 and Rank3 has a resistance Rtt_Nom1.

FIG. 8 is a timing diagram for explaining an operation of the memory system illustrated in FIG. 1. FIG. 8 is a timing diagram when a command CMD issued from the memory controller 90 is a read command RD. Referring to FIGS. 1 to 8, each of a plurality of ODT signals ODT0, ODT1, ODT2 and ODT3 indicates an ODT signal ODTi of each of a plurality of memory devices included in each of a plurality of ranks (Rank0, Rank1, Rank2 and Rank3), and each of a plurality of termination resistors (Rtt0, Rtt1, Rtt2 and Rtt3) indicates each termination resistor of the plurality of memory devices included in each of the plurality of ranks (Rank0, Rank1, Rank2 and Rank3).

When a level of an ODT signal ODT0 at each rising edge of a clock signal CK has a value of don't care, 'X', during a plurality of clock cycles CC0, CC1, CC2 and CC3, resistance of the termination resistor Rtt0 is changed from a resistance Rtt_Nom0 to a resistance Ron. The resistance Ron is a high impedance and the ODT circuit 40 is turned off. That is, on-die termination off ODT OFF.

'X' of FIG. 8 depicts a level of an ODT signal ODT0 is don't care. When a level of an ODT signal ODT1 at each rising edge of a clock signal CK is all high 'H' during a plurality of clock cycles CC2 and CC3, resistance of a termination resistor Rtt1 is changed from a resistance Rtt_Nom1 to a resistance Rtt_Nom0. In FIG. 8, reference character CL indicates a column address strobe bar signal CAS# latency.

When a level of an ODT signal ODT3 at each rising edge of a clock signal CK during a plurality of clock cycles CC0, CC1, CC2 and CC3 is all low, resistance of a termination resistor Rtt3 retains a resistance Rtt_Nom1. Subsequently, data are read from one of a plurality of memory devices, included in a rank Rank0, in response to a read command RD.

In addition, when a level of an ODT signal ODT2 at each rising edge of a clock signal CK during a plurality of clock cycles CC0, CC1, CC2 and CC3 is low, high, low and high in turn, a command is issued in response to the ODT signal ODT2. For example, the command is a refresh command REF.

Accordingly, a plurality of memory devices included in a rank Rank2 are refreshed in response to a refresh command REF. Here, resistance of a termination resistor Rtt2 is a resistance Rtt_Nom1 and is not changed.

Figure 9:
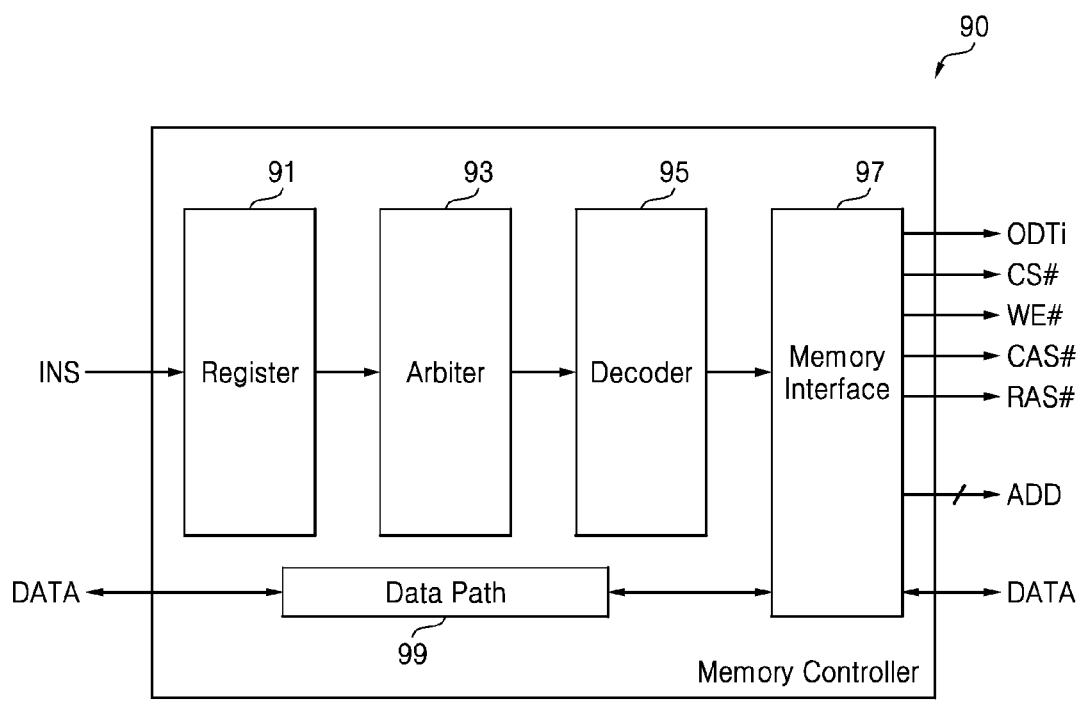
FIG. 9 is a block diagram of the memory controller illustrated in FIG. 1.

FIG. 9 is a block diagram of the memory controller illustrated in FIG. 1. Referring to FIGS. 1 and 9, the memory controller 90 includes a register 91, an arbiter 93, a decoder 95, a memory interface 97 and a data pass 99.

The register 91 stores instructions INS output from a processor (not shown). The arbiter 93 selects which instruction among the instructions INS to process next.

The decoder 95 decodes a command selected by the arbiter 93, generates a plurality of control signals CS#, WE#, CAS#, RAS# and ODTi and an address ADD according to a decoding result and transmits them to a memory device, e.g., 10-1. The decoder 95, when the memory device 10-1 is powered down, may generate an ODT signal ODTi so that a command selected by the arbiter 93 may be issued by an ODT signal ODTi.

The memory interface 97 transmits a plurality of control signals CS#, WE#, CAS#, RAS# and ODTi and an address ADD, which are generated in the decoder 95, to the memory device 10-1. The memory interface 97 may include an ODT circuit (not shown) including a termination resistor (not shown).

The processor and the memory device 10-1 may transmit and receive data through the memory interface 97 and a data path 99.

Figure 10:
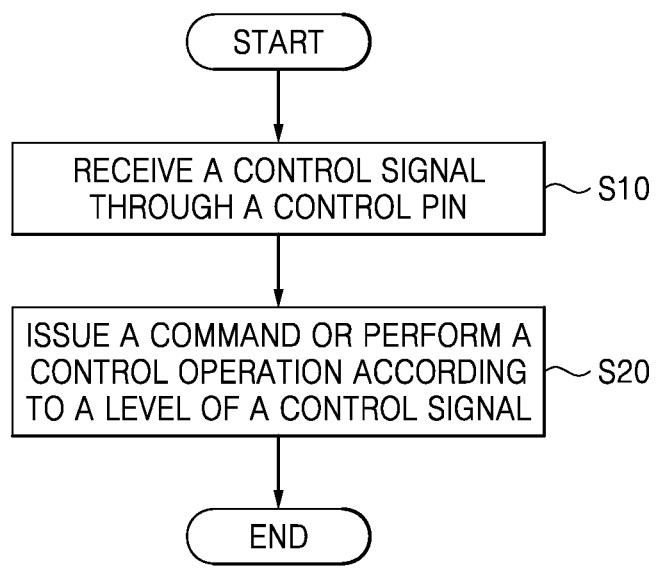
FIG. 10 is a flowchart for explaining an operation of the memory device illustrated in FIG. 3.

FIG. 10 is a flowchart for explaining an operation of the memory device illustrated in FIG. 4. Referring to FIGS. 1 to 10, the memory device 10 receives a control signal through a control pin (S10). For example, when the control pin is an ODT pin 11, the memory device 10 receives an ODT signal ODTi.

The memory device 10 issues a command or performs a control operation according to a level of a control signal. For example, the memory device 10 issues a command or control an ODT circuit 33 according to a level of the ODT signal ODTi.

When a level of the ODT signal ODTi at each edge of a clock signal CK is continuously high, a termination resistance is changed in response to the ODT signal ODTi. In addition, when a level of the ODT signal ODTi at each edge of the clock signal CK is toggling, a command is issued in response to the ODT signal ODTi.

An operation of issuing a command, changing a termination resistance of an ODT circuit, turning on the ODT circuit 33, and/or turning off the ODT circuit 33 according to example embodiments may be performed according to various levels of the ODT signal ODTi. Besides, according to example embodiments, the memory device 10 may perform a control operation (e.g., a clock enable operation) or issue a command (e.g., a refresh command or a precharge all banks command) by using a CKE pin 13.

Figure 11:
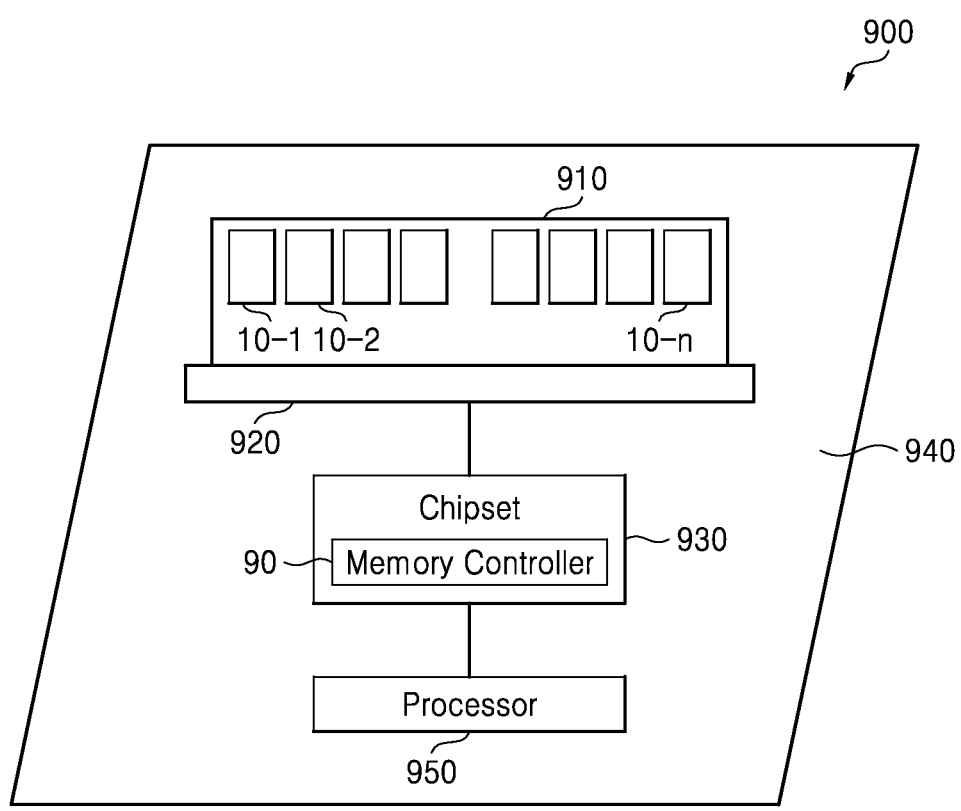
FIG. 11 is another block diagram of the memory system according to example embodiments.

FIG. 11 is another block diagram of the memory system according to example embodiments. Referring to FIGS. 3 and 11, a memory system 900 which may be embodied in a personal computer (PC), a tablet PC or a mobile computing device includes a main board 940, a slot 920 mounted on the main board 940, a memory module 910 which may be inserted in the slot 920 and a chipset 930 which may control an operation of a plurality of memory devices 10-1, 10-2, . . . , and 10-n mounted on the memory module 910 through the slot 920, and a processor 950 for communicating with the plurality of memory devices 10-1, 10-2, . . . , 10-n.

Each of the plurality of memory devices 10-1, 10-2, . . . , 10-n is the memory device 10 illustrated in FIG. 3. There is only illustrated the memory module 910; however, the memory system 900 includes at least one memory module. The chipset 930 is used to transmit or receive data, an address or control signals between the processor 950 and the memory module 910. The chipset 930 includes the memory controller 90. According to an example embodiment, the memory controller 90 may be embodied in the processor 950.

Figure 12:
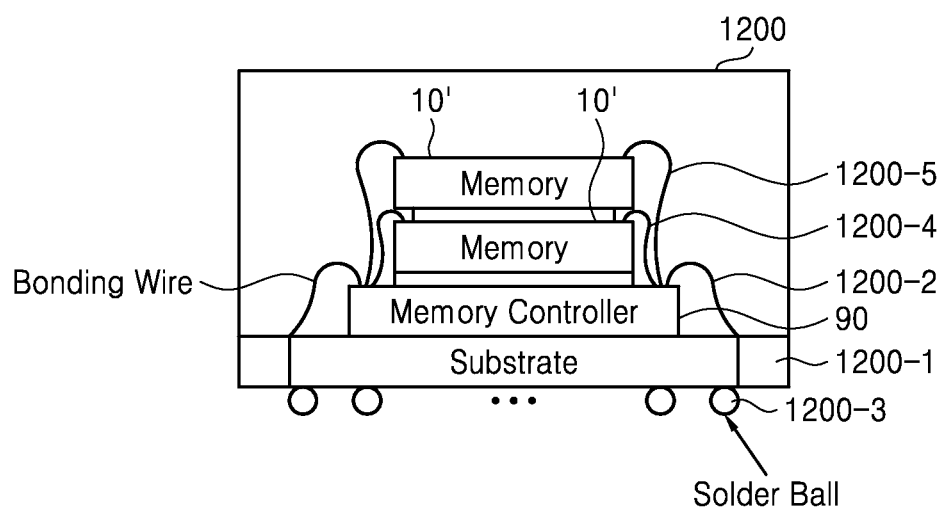
FIG. 12 is a multi-chip package according to example embodiments that includes the memory device illustrated in FIG. 1.

FIG. 12 illustrates a multi-chip package according to example embodiments that includes the memory device illustrated in FIG. 1. Referring to FIGS. 4 and 12, a multi-chip package 1200 includes the memory controller 90 formed on a circuit substrate 1200-1, e.g., a printed circuit board (PCB), and a plurality of memory devices 10' formed on the memory controller 90. Each of the plurality of memory devices 10' is the memory device 10 illustrated in FIG. 3.

The memory controller 90 may communicate with an external device through bonding wires 1200-2 and solder balls 1200-3. Moreover, the memory controller 90 and the plurality of memory devices 10' may communicate with each other through a plurality of bonding wires 1200-4 and 1200-5.

For convenience of explanation in FIG. 12, it is illustrated that the plurality of memory devices 10' are formed on the memory controller 90; however, a location of the plurality of devices 10' and 90 may be changed each other according to example embodiments. In addition, the memory controller 90 and the plurality of memory devices 10' may communicate with each other through a connection means besides the plurality of bonding wires 1200-4 and 1200-5, and the memory controller 90 and the solder balls 1200-3 may be connected to each other through a connection means besides the bonding wires 1200-2. The connection means may be embodied in a vertical electrical element, e.g., through silicon via (TSV).

An operation method of a memory device according to example embodiments of inventive concepts and apparatuses for performing the method may issue a command according to a level of a control signal input through a control pin.

While some example embodiments have been particularly shown and described, it will be understood by those of ordinary skill in the art that various changes in forms and details may be made therein without departing from the spirit and scope of the claims.

What is claimed is:
1. A method for operating a memory device comprising:
receiving an ODT signal through an on-die termination (ODT) pin; and
issuing a command or controlling an ODT circuit according to the ODT signal, wherein
the command is a refresh command, or
the command is a pre-charge all banks command, or
the command is issued when the memory device is powered down.

2. The method of claim 1, wherein
the ODT circuit includes a termination resistor, and
the controlling the ODT circuit includes one of changing a resistance of the termination resistor of the ODT circuit, turning on the ODT circuit, and turning off the ODT circuit.

3. The method of claim 2, wherein the resistance of the termination resistor is changed in response to the ODT signal when the level of the ODT signal at every edge of a clock signal is continuously high.

4. The method of claim 1, wherein the command is issued in response to the ODT signal when the level of the ODT signal at each edge of clock signal is toggling.

5. The method of claim 1, wherein the command is the refresh command.

6. The method of claim 1, wherein the command is the precharge all banks command.

7. The method of claim 1, wherein the command is issued when the memory device is powered down.

8. A memory device comprising:
an on-die termination (ODT) pin configured to receive an ODT signal;
an ODT detector configured to detect the ODT signal;
a command decoder configured to issue a command according to the ODT signal, wherein
the command is a refresh command,
the command is a precharge all banks command, or
the command is issued when the memory device is powered down;
an ODT circuit including a termination resistor and a switch; and
an ODT control circuit configured to at least one of change a termination resistance of the ODT circuit, turn on the ODT circuit, and turn off the ODT circuit according to a level of the ODT signal.

9. The memory device of claim 8, wherein the ODT detector comprises:
a plurality of latches, and
a ith latch (1<i≤(N−1)) among the plurality of latches detects a level of an output signal of a (i−1)th latch in response to a clock signal.

10. The memory device of claim 8, wherein the ODT control circuit is configured to change the termination resistance in response to the ODT signal when the level of the ODT signal detected at each edge of a clock signal is continuously high.

11. The memory device of claim 8, wherein the command decoder is configured to issue the command in response to the ODT signal when the level of the ODT signal at each edge of a clock signal is toggling.

12. The memory device of claim 8, wherein the command is the refresh command.

13. The memory device of claim 8, wherein the command is the precharge all banks command.

14. A memory module comprising:
at least one rank including at least one memory device of claim 8.

15. The memory module of claim 14, wherein the memory module is a dual in-line memory module (DIMM), a dual in-line package memory, a single in-line pin package (SIPP) memory, a single in-line memory module (SIMM), a dual in-line memory module (DIMM) or a small outline DIMM (SO-DIMM).

16. A memory device comprising:
an ODT detector configured to generate a first and a second group of signals in response to an ODT signal and a clock signal;
an ODT control circuit connected to an ODT circuit,
the ODT control circuit configured to receive the first group of signals and control an operation of the ODT circuit in response to the first group of signals; and
a control logic connected to a memory cell array, the control logic configured to receive the second group of signals and issue a command to the memory cell array in response to the second group of signals.

17. The memory device of claim 16, wherein the command is a refresh command.

18. The memory device of claim 16, wherein the command is a precharge all banks command.

19. The memory device of claim 16, wherein
the ODT controller includes,
a first latch configured to generate a first detection signal in response to detecting a first level of the ODT signal corresponding to a first edge of the clock signal;
a second latch configured to generate a second detection signal in response to detecting a second level of the ODT signal corresponding to a second edge of the clock signal;
a third latch configured to generate a third detection signal in response to detecting a third level of the ODT signal corresponding to a third edge of the clock signal; and
a fourth latch configured to generate a fourth detection signal in response to detecting a fourth level of the ODT signal corresponding to a fourth edge of the clock signal;
the ODT controller is configured to generate the first group of signals based on the first and second detection signals; and
the ODT controller is configured to generate the second group of signals based on the first to fourth detection signals.

20. The memory device of claim 16, further comprising:
an on-die termination (ODT) pin configured to receive the ODT signal and output the ODT signal to the ODT detector.

* * * * *